United States Patent
Fujii

(10) Patent No.: US 6,380,838 B1
(45) Date of Patent: Apr. 30, 2002

(54) SEMICONDUCTOR DEVICE WITH REPAIR FUSES AND LASER TRIMMING METHOD USED THEREFOR

(75) Inventor: Hideki Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 136 days.

(21) Appl. No.: 09/588,723

(22) Filed: Jun. 7, 2000

(30) Foreign Application Priority Data

Jun. 7, 1999 (JP) .......................................... 11-159778

(51) Int. Cl.$^7$ ...................... H01H 85/046; H01H 85/10; H01L 27/115; H01L 21/762
(52) U.S. Cl. ...................... 337/283; 337/297; 337/159; 337/416; 257/209; 257/529; 438/601
(58) Field of Search ............................. 337/5, 158–161, 337/283, 290, 296–298, 401, 404, 405, 416, 417; 257/209, 529, 530; 438/467, 600, 601

(56) References Cited

U.S. PATENT DOCUMENTS

| | | | | |
|---|---|---|---|---|
| 5,523,253 A | * | 6/1996 | Gilmour et al. | 437/60 |
| 5,808,351 A | * | 9/1998 | Nathan et al. | 257/528 |
| 5,905,295 A | * | 5/1999 | Prall et al. | 257/529 |
| 5,949,323 A | * | 9/1999 | Huggins et al. | 337/401 |
| 6,150,916 A | * | 11/2000 | Lin et al. | 337/297 |
| 6,215,173 B1 | * | 4/2001 | Echigoya | 257/665 |
| 6,225,652 B1 | * | 5/2001 | Devanney | 257/209 |

FOREIGN PATENT DOCUMENTS

| | | | | |
|---|---|---|---|---|
| JP | 61-168242 | * | 7/1986 | H01L/21/82 |
| JP | 63-198354 | * | 8/1988 | H01L/21/82 |
| JP | 5-29467 | | 2/1993 | |
| JP | 5-136271 | * | 6/1993 | H01L/21/82 |
| JP | 6-120349 | * | 4/1994 | H01L/21/82 |
| JP | 6-310603 | * | 11/1994 | H01L/21/82 |
| JP | 7-273200 | * | 10/1995 | H01L/21/82 |

\* cited by examiner

*Primary Examiner*—Leo P. Picard
*Assistant Examiner*—Anatoly Vortman
(74) *Attorney, Agent, or Firm*—McGinn & Gibb, PLLC

(57) ABSTRACT

A semiconductor device with repair fuses is provided, which decrease the fuse pitch and the fuse occupation area without short circuit among the adjoining repair fuses and damage to the semiconductor device itself. The device comprises (a) a semiconductor substrate; (b) elongated repair fuses having an equal width b formed on the substrate; the fuses being arranged in substantially parallel to each other at a pitch a; (c) a layer formed to cover the fuses; the layer having an opening that exposes the fuses and that allows the fuses to receive a laser beam from the outside; the beam having a placement tolerance h for each fuse; the beam being designed to form an irradiation area with a diameter d for each fuse in the opening; the irradiation area for each fuse being arranged along a virtual zigzag shape in the opening; and (d) a relationship of $$d \geq a \geq \left(\frac{b+d}{2} + h\right)$$

is established. Preferably, each fuse has a reference point at a middle point of its exposed part from the opening. Each area is located in such a way that a center of the area has an offset distance e from the reference point of the corresponding fuse. The offset distance e satisfies the relationship of $2e \geq \sqrt{d^2-a^2}$. It is preferred that the opening is substantially rectangular.

19 Claims, 10 Drawing Sheets

| F0001 | 100.02 | 865.32 |
|---|---|---|
| F0002 | 96.02 | 865.32 |
| F0003 | 92.02 | 865.32 |
| F0004 | 88.02 | 865.32 |
| F0005 | 84.02 | 865.32 |
| . | . | . |
| . | . | . |
| . | . | . |
| F9995 | −84.02 | 865.32 |
| F9996 | −88.02 | 865.32 |
| F9997 | −96.02 | 865.32 |
| F9999 | −100.02 | 865.32 | ns
SEMICONDUCTOR DEVICE WITH REPAIR FUSES AND LASER TRIMMING METHOD USED THEREFOR

BACKGROUND OF THE INVENTION

1. Field of the Invention

The present invention relates to a semiconductor device and more particularly, to a semiconductor device with repair fuses and redundant circuits and a method of trimming the semiconductor device using a laser beam, which make it possible to save defective semiconductor devices by activating redundant circuits with the use of repair fuses as necessary. The present invention is preferably applied to fabrication of large-capacity semiconductor memory devices equipped with redundant or reserve memory cells.

2. Description of the Related Art

In recent years, large-capacity semiconductor memory devices typically have redundant circuits with reserve memory cells. If some of the memory cells in a semiconductor memory device are found defective in a testing operation, the defective memory cells are identified and replaced with reserve memory cells in the redundant circuits as necessary. Thus, the defect of the semiconductor memory device is repaired; in other words, the semiconductor memory device including the defective memory cells can be saved.

To activate the reserve memory cells in the redundant circuits (i.e., to use the redundant memory cells), after the defective memory cells are identified, they need to be electrically disconnected from the memory cell array and furthermore, the redundant or reserve memory cells need to be electrically connected to the same array instead. Such switching or replacement of electrical connection as explained here is usually realized by mechanically and electrically disconnecting specific wiring lines by way of the repair fuses provided beforehand in the device as necessary.

In the step of repairing the defective memory cell array or saving the defective semiconductor memory device, "redundancy analysis" is carried out on the basis of test result about whether the individual bit lines and word lines have gotten a pass or fail, thereby identifying the repair fuses to be fused and disconnected. Then, a laser beam is irradiated to the repair fuses thus identified using a laser repair system to disconnect the desired fuses. This step is termed the "laser trimming" step.

A method of repairing defective memory cells in a semiconductor memory device using redundant memory cells is briefly explained below.

FIGS. 1 and 2 show a typical configuration of a semiconductor memory device with redundant memory cells and repair fuses.

As shown in FIG. 2, the semiconductor memory device is equipped with a memory cell array 410 including memory cells, a redundant memory cell row 425 that corresponds to a memory cell row of the array 410, and a redundant memory cell column 426 that corresponds to a memory cell column of the array 410. The redundant row and column 425 and 426 are included in a redundant circuit.

Actually, the array 410 includes a large number of memory cells. However, for the sake of simplification of description, the array 410 is illustrated and explained as a 4×4 array, in other words, the array 410 has only four rows and four columns. Also, the following explanation is referred to the redundant memory cell row 425 alone, because the same explanation is applicable to the redundant memory cell column 426.

As shown in FIGS. 1 and 2, the first memory cell row 421 having the Y address of 0 in the array 410 is connected to the output terminal of an AND circuit 431. The second memory cell row 422 having the Y address of 1 in the array 410 is connected to the output terminal of an AND circuit 432. The third memory cell row 423 having the Y address of 2 in the array 410 is connected to the output terminal of an AND circuit 433. The fourth memory cell row 424 having the Y address of 3 in the array 410 is connected to the output terminal of an AND circuit 434.

The rows 421, 422, 423, and, 424 are respectively selected and activated when the output signals B1, B2, B3, and B4 of the AND circuits 431, 432, 433, and 434 have a value of "0", i.e., they are in the state of logic low (L). On the other hand, when the output signals B1, B2, B3, and B4 of the AND circuits 431, 432, 433, and 434 have a value of "1", i.e., they are in the state of logic high (H), the rows 421, 422, 423, and 424 are respectively disconnected from the array 410, i.e., they are inactivated.

The redundant memory cell row 425 is connected to the output terminal of an AND circuit 443. The row 425 is selected and electrically connected to the array 410 (i.e., activated) when the output signal B5 of the circuit 443 has a value of "1".

The AND circuit 431 receives three input signals, i.e., an inverted signal of the selection signal A0, an inverted signal of the selection signal A1, and an inverted signal of the output signal D1 of a NOT circuit 445. Similarly, the AND circuit 432 receives the selection signal A0, the inverted signal of the selection signal A1, and the inverted signal of the output signal D1. The AND circuit 433 receives the inverted signal of the selection signal A0, the selection signal A1, and the inverted signal of the output signal D1. The AND circuit 434 receives the selection signal A0, the selection signal A1, and the inverted signal of the output signal D1.

An input terminal of an Ex-OR (Exclusive Or) circuit 441 receives the selection signal A0 and another input terminal thereof is connected to a terminal of a fuse 451 and a terminal of a resistor 461. The other terminal of the fuse 451 is connected to a power supply line supplied with a power supply voltage $V_{cc}$. The other terminal of the resistor 461 is connected to the ground.

An input terminal of an Ex-OR circuit 442 receives the selection signal A1 and another input terminal thereof is connected to a terminal of a fuse 452 and a terminal of a resistor 462. The other terminal of the fuse 452 is connected to the power supply line of $V_{cc}$. The other terminal of the resistor 462 is connected to the ground.

An input terminal of a NOT circuit 444 is connected to a terminal of a fuse 453 and a terminal of a resistor 463. The other terminal of the fuse 453 is connected to the power supply line of $V_{cc}$. The other terminal of the resistor 463 is connected to the ground.

The AND circuit 443 receives the output signal C1 of the EX-OR circuit 441, and the output signal C2 of the EX-OR circuit 442, and the output signal D2 of the NOT circuit 444. The NOT circuit 445 receives the output signal B5 of the NAD circuit 443.

The semiconductor memory device shown in FIGS. 1 and 2 operates in the following way.

As described above, when the output signal B5 of the AND circuit 443 has a value of "1", the redundant memory cell row 425 is selected and activated. In this case, the output signal D1 of the NOT circuit 445 (i.e., the redundant signal) has a value of "0" and therefore, all the AND circuits 431, 432, 433, and 434 receive the signal value of "1". Thus, any one of the output signals B1, B2, B3, and B4 can be set to have a value of "1" by changing the combination of the values "0" and "1" in the selection signals A0 and A1. This means that any one of the memory cell rows 421, 422, 423, and 424 can be set nonselective, in other words, any one of the rows 421, 422, 423, and 424 can be electrically disconnected from the array 410. At the same time as this disconnection, the redundant row 425 is selected and electrically connected to the array 410 instead.

On the other hand, when the output signal B5 of the AND circuit 443 has a value of "0", the redundant row 425 is not selected. In this case, the output signal D1 of the NOT circuit 445 (i.e., the redundant signal) has a value of "1" and therefore, all the AND circuits 431, 432, 433, and 434 receive the signal value of "0". Thus, all the output signals B1, B2, B3, and B4 have a value of "0", which means that all the rows 421, 422, 423, and 424 are selected and activated.

The fuse 453 is fused and cut when the redundant row 425 is selected or activated. The fuse 451 is fused and cut when the selection signal A0 has a value of "0". The fuse 452 is fused and cut when the selection signal A1 has a value of "0".

Here, as shown in FIGS. 1 and 2, it is supposed that the memory cell 427 having the X address of 2 and the Y address of 2 in the memory cell array 410 is defective. In this case, to select the row 423 including the defective cell 427 in the array 410, the values of the selection signals A0 and A1 are set at "0" and "1", respectively. At this time, the fuse 451 is fused and cut since the selection signal A0 has a value of "0". The fuse 453 is fused and cut for selecting and activating the redundant row 425. As a result, the EX-OR circuit 441 and the NOT circuit 444 receive signal values of "0". On the other hand, because the fuse 452 is not cut, the EX-OR circuit 442 receives a signal value of "1".

Accordingly, the output signals C1 and C2 of the EX-OR circuits 441 and 442 have values of "1" and the output signal D2 of the NOT circuit 444 has a value of "1". Furthermore, the output signals B5 and B3 of the AND circuits 443 and 433 have values of "1" and the output signals B1, B2, and B4 of the AND circuits 441, 442, and 444 have values of "0". Thus, the redundant row 425 is electrically connected to the array 410 and the defective row 423 is electrically disconnected therefrom.

When the selection signal A0 does not have a value of "0" and/or the selection signal A1 does not have a value of "1", the redundant row 425 is not selected and activated while none of the rows 421, 422, 423, and 424 are electrically disconnected from the array 410.

The above-described circuit configuration of semiconductor memory devices that makes it possible to activate a redundant cell or cells instead of a defective cell or cells as necessary has been used and is now being used popularly.

Next, the configuration of a prior-art semiconductor device with repair fuses is explained below with reference to FIG. 3.

As shown in FIG. 3, a prior-art semiconductor device 500 is comprised of a semiconductor substrate 501 and repair fuses 550 formed on the substrate 501. The fuses 550 can be fused and cut by irradiating a laser beam from the outside. Actually, several hundreds or thousands of the fuses 550 are provided on the substrate 501. However, only six out of the fuses 550 are illustrated in FIG. 3 for the sake of simplification of explanation.

The fuses 550, which are made of a patterned conductive layer, are arranged on a first dielectric layer (not shown) formed on the surface of the substrate 501. Each of the fuses 550 has a strip-like shape. The fuses 550 are arranged in parallel at the same pitch. Both ends of each fuse 550 are electrically connected to an internal circuit (not shown) of the semiconductor device 500, where the internal circuit has a redundant circuit or circuits.

A second dielectric layer (not shown) is formed on the first dielectric layer to cover all the fuses 550. The second dielectric layer has a function of protecting the fuses 550.

A third dielectric layer (not shown), which has a rectangular opening or window 505, is formed on the second dielectric layer. As shown in FIG. 3, the longitudinal axis of the opening 505 is parallel to the X axis while the strip-shaped fuses 550 extend along the Y axis perpendicular to the X axis. The opening 505 serves as an irradiation window of a laser beam.

The width b' of each fuse 550 is the same. For example, b' is set at 1 μm. The pitch a' of the fuses 550 is set to be equal to the sum of the diameter d' of a circular laser beam irradiation area (i.e., laser beam spot) 560 and the acceptable placement error range (i.e., tolerance) h' of a laser beam. In other words, the relationship that "a'=d'+h'" is established. For example, the diameter d' of the area or spot 560 is set at 4 μm. The width c' of the opening 505 is set at, for example, 6 μm. The length g' of the opening 505 is set at a proper value responsive to the pitch a', the width b', and the count of the fuses 550.

The fuses 550 are selectively fused and cut by irradiating a laser beam through the opening 505. For example, if the second and fifth fuses 550 that are respectively located at the second and fifth positions from the left-hand side of the opening 505 need to be cut, a laser beam 570 is irradiated to the second fuse 550 and then, it is irradiated to the fifth fuse 550 by way of the opening 505. As a result, as shown in FIG. 3, the parts of the fuses 550 to which the beam 570 has been irradiated are fused and cut.

Generally, after irradiation of a laser beam to a specific part of a repair fuse is completed, the irradiated and fused part of the fuse tends to solidify again, resulting in solid residual parts. Thus, there is a possibility that the residual parts of the repair fuses 550 provided in the prior-art device 500 are in contact with each other, thereby causing short circuit among the fuses 550 thus cut.

Such the short-circuit problem as above can be prevented if the pitch a' of the fuses 550 is increased. In this case, however, there arises a problem that the occupation area of the fuses 550 (i.e., the fuse occupation area) tends to be wider.

To prevent the problem relating to short circuit among the residual parts of the fuses, some techniques have been developed and disclosed. An example of these techniques is disclosed in the Japanese Non-Examined Patent Publication No. 6-120349 published in 1994. In the technique disclosed, the irradiation position of a laser beam onto each repair fuse is alternately shifted in the longitudinal direction of the fuses.

By the way, in recent years, there is a growing trend to further reduce the chip size and to integrate more electronic elements, which requires making the fuse occupation area as small as possible. To meet the requirement, there are ways to reduce the dimension of the fuses themselves and to narrow the pitch of the fuses. However, these two ways will cause other problems as explained below.

Specifically, if the fuses 550 are miniaturized in the prior-art semiconductor device 500, the width b' of the fuses 550 decreases and as a result, the energy absorbing efficiency or rate of the fuses 550 from the laser beam 570 declines. Thus, to ensure fusing and cut of the fuses 550, the spot diameter d' of the beam 570 needs to be expanded and at the same time, the energy of the beam 570 needs to be raised. In this case, however, there arises a problem that the fuses 550 are broken or damaged at unwanted positions other than the irradiated parts, damaging the device 500 itself. Accordingly, it is difficult or unable to reduce the fuse occupation area by miniaturization of the fuses 550.

If the pitch a' of the fuses 550 is decreased instead, there arises a problem that the unwanted, adjacent fuses 550 are fused and cut in error. To solve this problem, various techniques that decrease the pitch a' without the cutting or fusing error of the fuses 550 have been developed and proposed.

For example, the Japanese Non-Examined Patent Publication No. 7-273200 published in 1995 discloses a semiconductor device with fuses. In the device, a reflection plate for reflecting a laser beam is provided so as to cover the fuses. The plate has irradiation windows that expose specific irradiation areas of the respective fuses. The windows for the adjoining fuses are alternately shifted in position along the longitudinal direction of the fuses.

The Japanese Non-Examined Patent Publication No. 5-29467 published in 1993 discloses a fuse for redundant circuits, in which a laser beam irradiation window is provided to cover the fuses. The window is formed continuously in a zigzag shape.

The techniques disclosed in the Publication Nos. 7-273200 and 5-29467 are able to decrease the pitch of the fuses. However, the technique disclosed in the Publication No. 7-273200 necessitates an additional process step of providing the reflection plate. As a result, it has a problem that the fabrication cost of a semiconductor device is raised.

On the other hand, the technique disclosed in the Publication No. 5-29467 requires a layer reflecting a laser beam for shielding the peripheral area of the laser beam irradiation window against the beam. Thus, there is a problem of raising the fabrication cost similar to the technique disclosed in the Publication No. 7-273200.

SUMMARY OF THE INVENTION

Accordingly, an object of the present invention is to provide a semiconductor device with repair fuses and a laser trimming method therefor that decrease the fuse pitch without short circuit among the adjoining repair fuses and damage to the semiconductor device itself.

Another object of the present invention is to provide a semiconductor device with repair fuses and a laser trimming method therefor that decrease the fuse occupation area without short circuit among the adjoining repair fuses and damage to the semiconductor device itself.

Still another object of the present invention is to provide semiconductor device with repair fuses and a laser trimming method therefor that decrease the fuse pitch and the fuse occupation area without increasing the fabrication cost of the semiconductor device.

The above objects together with others not specifically mentioned will become clear to those skilled in the art from the following description.

According to a first aspect of the present invention, a semiconductor device is provided, which comprises:

(a) a semiconductor substrate;
(b) elongated repair fuses formed on the substrate;
   the fuses being arranged in substantially parallel to each other at a pitch a;
   each of the fuses having a width b;
(c) a layer formed to cover the fuses;
   the layer having an opening that exposes the fuses and that allows the fuses to receive a laser beam from the outside;
   the beam having a placement tolerance h for each of the fuses in the opening;
   the beam being designed to form an irradiation area with a diameter d for each of the fuses in the opening;
   the irradiation area for each of the fuses being arranged along a virtual zigzag shape in the opening; and
(d) a relationship of $$d \geq a \geq \left(\frac{b+d}{2} + h\right)$$

is established among the pitch a, the width b, and the placement tolerance h.

With the semiconductor device according to the first aspect of the invention, the pitch a and the width b of the fuses are determined so as to satisfy the above-described relationship and at the same time, the laser beam is irradiated to the fuses as necessary in such a way that the irradiation areas for the fuses are arranged along the virtual zigzag shape in the opening of the layer that covers the fuses. Thus, the pitch a of the fuses is set to be equal to or smaller than the diameter d of the irradiation areas of the laser beam. Also, the irradiation area for the desired or target fuse is not overlapped with the adjoining fuses to the target fuse, which means that the semiconductor device itself is not damaged due to irradiation overlapping of the laser beam.

As a result, the pitch a of the fuses can be reduced without short circuit among the adjoining fuses and damage to the semiconductor device itself. Due to the reduction of the pitch a, the occupation area of the fuses can be decreased, which is also realized without short circuit among the adjoining fuses and damage to the device itself.

Moreover, the reflection plate and the reflection layer used in the prior-art techniques in the Japanese Non-Examined Patent Publication Nos. 7-273200 and 5-29467 are not necessary in the semiconductor device according to the first aspect of the invention. Accordingly, the pitch a can be decreased without increasing the fabrication cost of the device.

Additionally, as described previously, the Japanese Non-Examined Patent Publication No. 6-120349 discloses the technique that the irradiation position of a laser beam onto each repair fuse is alternately shifted in the longitudinal direction of the fuses. However, the technique in the Publication No. 6-120349 intends only to prevent short circuit among the adjoining fuses. Accordingly, this technique is clearly different from the device according to the first aspect of the invention that aims at reduction of the fuse occupation area through fuse pitch decrease.

In a preferred embodiment of the device according to the first aspect of the invention, each of the fuses has a reference point at a middle point of its exposed part from the opening. Each of the irradiation areas is located in such a way that a center of the area has an offset distance e from the reference point of the corresponding fuse. The offset distance e satisfies the relationship of $$2e \geq \sqrt{d^2 - a^2}.$$

In this embodiment, it is preferred that the opening of the layer is substantially rectangular.

In another preferred embodiment of the device according to the first aspect of the invention, the opening of the layer has a substantially rectangular shape with a length c along the fuses and a width g perpendicular to the fuses. The length c is approximately equal to or less than (1.87×d).

According to a second aspect of the present invention, another semiconductor device is provided, which comprises:

(a) a semiconductor substrate;
(b) elongated repair fuses formed on the substrate;
   the fuses being arranged in substantially parallel to each other at a pitch a;
   each of the fuses having a width b;
(c) a layer formed to cover the fuses;
   the layer having an opening that exposes the fuses and that allows the fuses to receive a laser beam from the outside;
   the beam having a placement tolerance h for each of the fuses in the opening;
   the beam being designed to form a first irradiation area and a second irradiation area apart from each other for each of the fuses in the opening;
   each of the first irradiation areas and each of the second irradiation areas having an equal diameter d;
   the first irradiation area for each of the fuses being arranged along a first virtual zigzag shape and the second irradiation area for each of the fuses being arranged along a second virtual zigzag shape in the opening; and
(d) a relationship of $$d \geq a \geq \left(\frac{b+d}{2} + h\right)$$

is established among the pitch a, the width b, and the placement tolerance h.

With the semiconductor device according to the second aspect of the invention, it is obvious clear that approximately the same advantages as those in the semiconductor device according to the first aspect are present. There is an additional advantage that cutting of the specified or wanted fuses can be ensured and that the fusing and cutting of the fuses can be realized at a high rate even if the fuses are difficult to be cut.

In a preferred embodiment of the device according to the second aspect of the invention, each of the fuses has a reference point at a middle point of its exposed part from the opening. Each of the first irradiation areas is located in such a way that a center of the first irradiation area has a first offset distance e from the reference point of the corresponding fuse. Each of the second irradiation areas is located in such a way that a center of the second irradiation area has a second offset distance f from the reference point of the corresponding fuse. The first offset distance e satisfies the relationship of $$2e \geq \sqrt{d^2 - a^2}.$$

The second offset distance f satisfies a relationship of f=n×e, where n is a positive constant.

In this embodiment, it is preferred that the opening of the layer is substantially rectangular.

In another preferred embodiment of the device according to the second aspect of the invention, the opening of the layer has a substantially rectangular shape with a length c along the fuses and a width g perpendicular to the fuses. The length c is approximately equal to or less than (3.73×d).

According to a third aspect of the present invention, a laser trimming method of a semiconductor device is provided, in which the device comprises
   (i) a semiconductor substrate;
   (ii) elongated repair fuses formed on the substrate;
      the fuses being arranged in substantially parallel to each other at a pitch a;
      each of the fuses having a width b; and
   (iii) a layer formed to cover the fuses;
      the layer having an opening that exposes the fuses.

The method comprises the steps of successively irradiating a laser beam to the respective fuses at a placement tolerance h, thereby forming irradiation areas with an equal diameter d for the respective fuses in the opening.

The beam is moved so as to arrange the irradiation areas for the respective fuses along a virtual zigzag shape in the opening while the pitch a, the width b, and the placement tolerance h satisfy a relationship of $$d \geq a \geq \left(\frac{b+d}{2} + h\right).$$

With the laser trimming method of a semiconductor device according to the third aspect of the invention, because of the same reason as described in the device according to the first aspect, approximately the same advantages as those in the device according to the first aspect are given.

In a preferred embodiment of the method according to the third aspect of the invention, each of the fuses has a reference point at a middle point of its exposed part from the opening. Each of the irradiation areas is located in such a way that a center of the area has an offset distance e from the reference point of the corresponding fuse. The offset distance e satisfies the relationship of $$2e \geq \sqrt{d^2 - a^2}.$$

In this embodiment, it is preferred that the opening of the layer is substantially rectangular.

In another preferred embodiment of the method according to the third aspect of the invention, the opening of the layer has a substantially rectangular shape with a length c along the fuses and a width g perpendicular to the fuses. The length c is approximately equal to or less than (1.87×d).

According to a fourth aspect of the present invention, another laser trimming method of a semiconductor device is provided, in which the device comprises
   (i) a semiconductor substrate;
   (ii) elongated repair fuses formed on the substrate;
      the fuses being arranged in substantially parallel to each other at a pitch a;
      each of the fuses having a width b; and
   (iii) a layer formed to cover the fuses;
      the layer having an opening that exposes the fuses.

The method comprises the steps of successively irradiating a laser beam to the respective fuses at a placement tolerance h, thereby forming a first irradiation area and a second irradiation area with an equal diameter d for each of the fuses in the opening. The first irradiation areas and the second irradiation areas are apart from each other on each of the fuses.

The beam is moved so as to arrange the first irradiation area for each of the fuses along a first virtual zigzag shape and the second irradiation area for each of the fuses along a second virtual zigzag shape in the opening while the pitch a, the width b, and the placement tolerance h satisfy a relationship of $$d \geq a \geq \left(\frac{b+d}{2}+h\right).$$

With the laser trimming method of a semiconductor device according to the fourth aspect of the invention, because of the same reason as described in the device according to the second aspect, approximately the same advantages as those in the device according to the second aspect are given.

In a preferred embodiment of the method according to the fourth aspect of the invention, each of the fuses has a reference point at a middle point of its exposed part from the opening. Each of the first irradiation areas is located in such a way that a center of the first irradiation area has a first offset distance e from the reference point of the corresponding fuse. Each of the second irradiation areas is located in such a way that a center of the second irradiation area has a second offset distance f from the reference point of the corresponding fuse. The first offset distance e satisfies the relationship of $$2e \geq \sqrt{d^2 - a^2}.$$

The second offset distance f satisfies a relationship of f=n×e, where n is a positive constant.

In this embodiment, it is preferred that the opening of the layer is substantially rectangular.

In another preferred embodiment of the method according to the fourth aspect of the invention, the opening of the layer has a substantially rectangular shape with a length c along the fuses and a width g perpendicular to the fuses. The length c is approximately equal to or less than (3.73×d).

BRIEF DESCRIPTION OF THE DRAWINGS

In order that the present invention may be readily carried into effect, it will now be described with reference to the accompanying drawings.

FIG. 7 is a schematic diagram showing the content of a data file used in the laser trimming method according to the first embodiment of the invention.

FIG. 8 is a schematic diagram showing the content of a data files used in the laser trimming method according to the first embodiment of the invention.

DETAILED DESCRIPTION OF THE PREFERRED EMBODIMENTS

Figure 1:
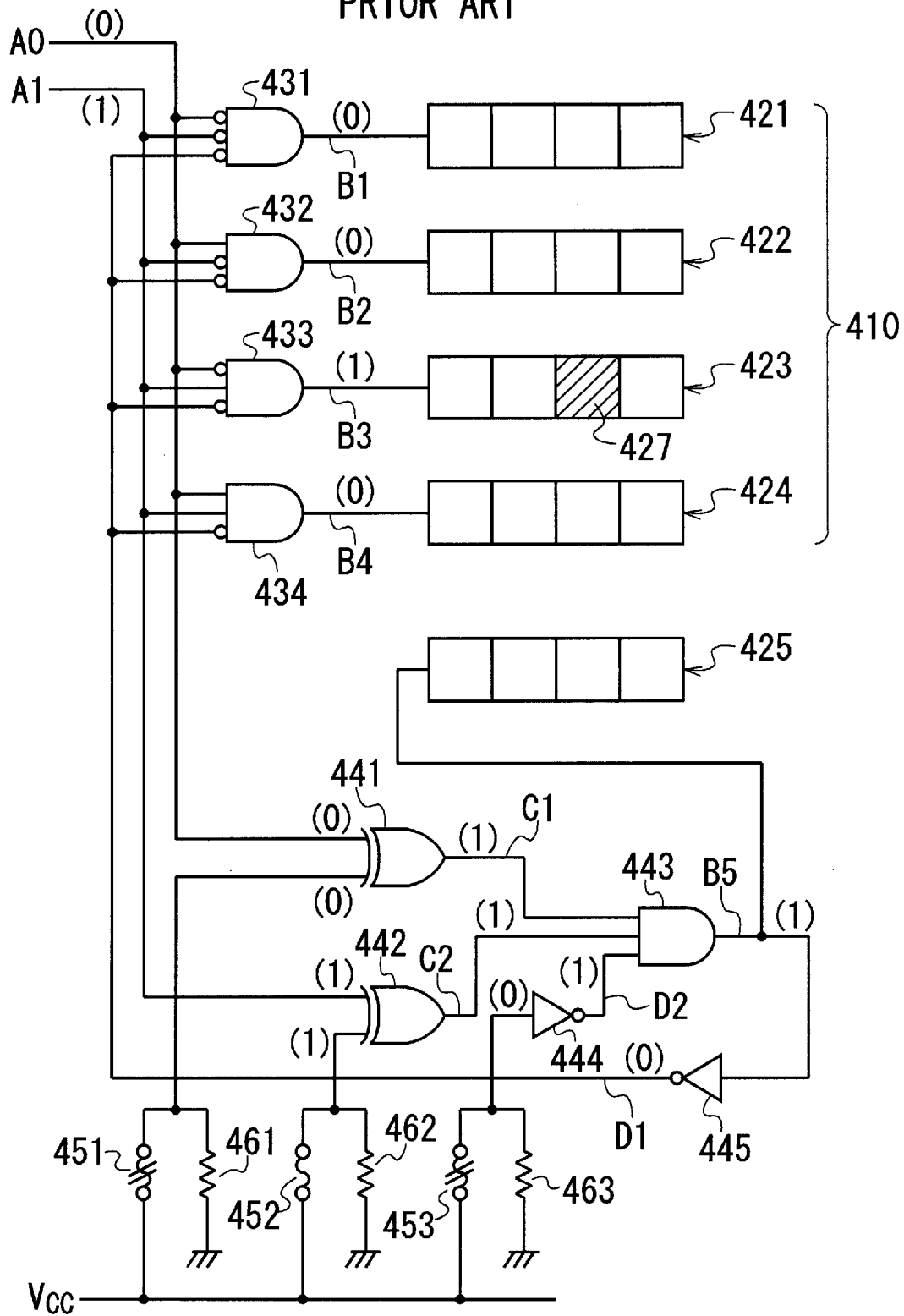
FIG. 1 is a schematic view showing a typical circuit configuration of a prior-art semiconductor memory device with a redundant circuit.
Figure 2:
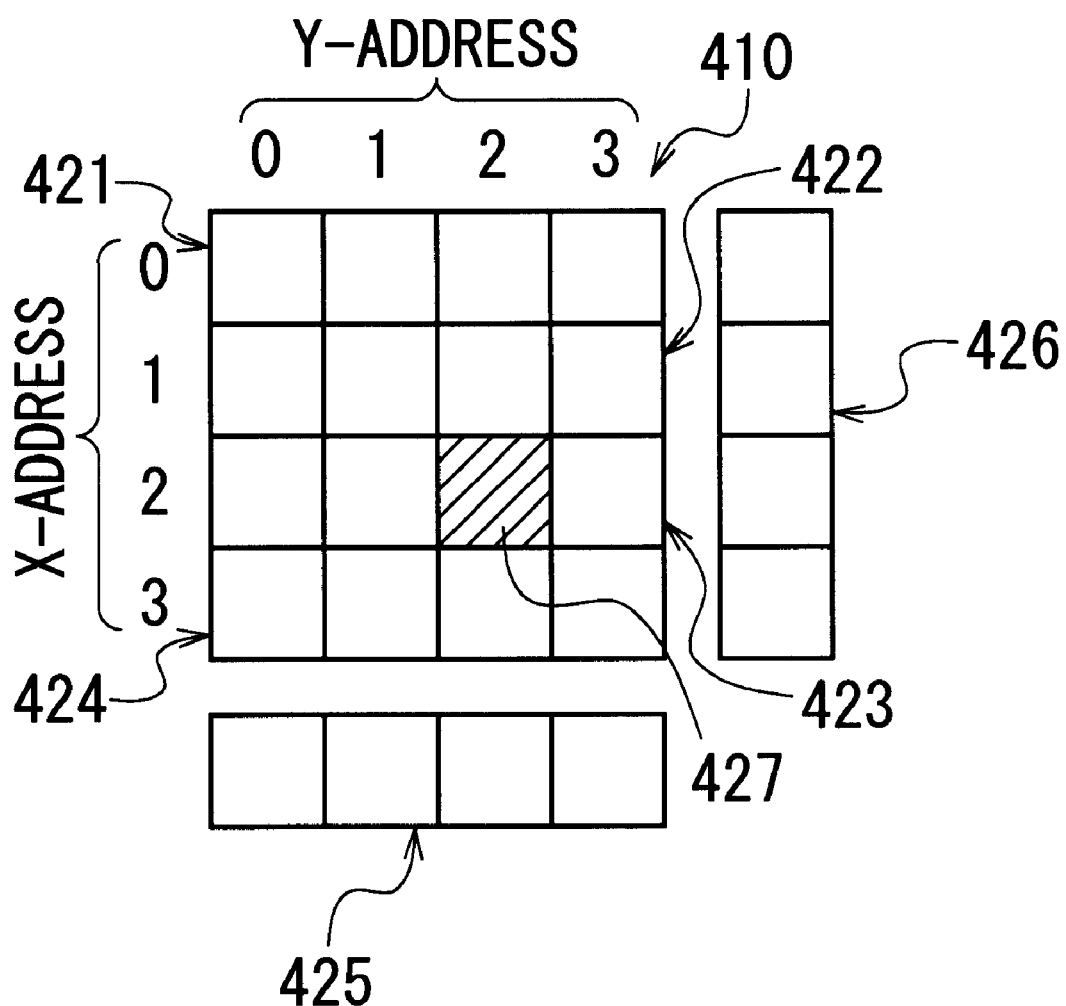
FIG. 2 is a schematic view showing a typical configuration of the memory cell array and the redundant memory cells of the prior-art semiconductor memory device shown in FIG. 1.

Preferred embodiments of the present invention will be described in detail below while referring to the drawings attached.

First Embodiment

Figure 4:
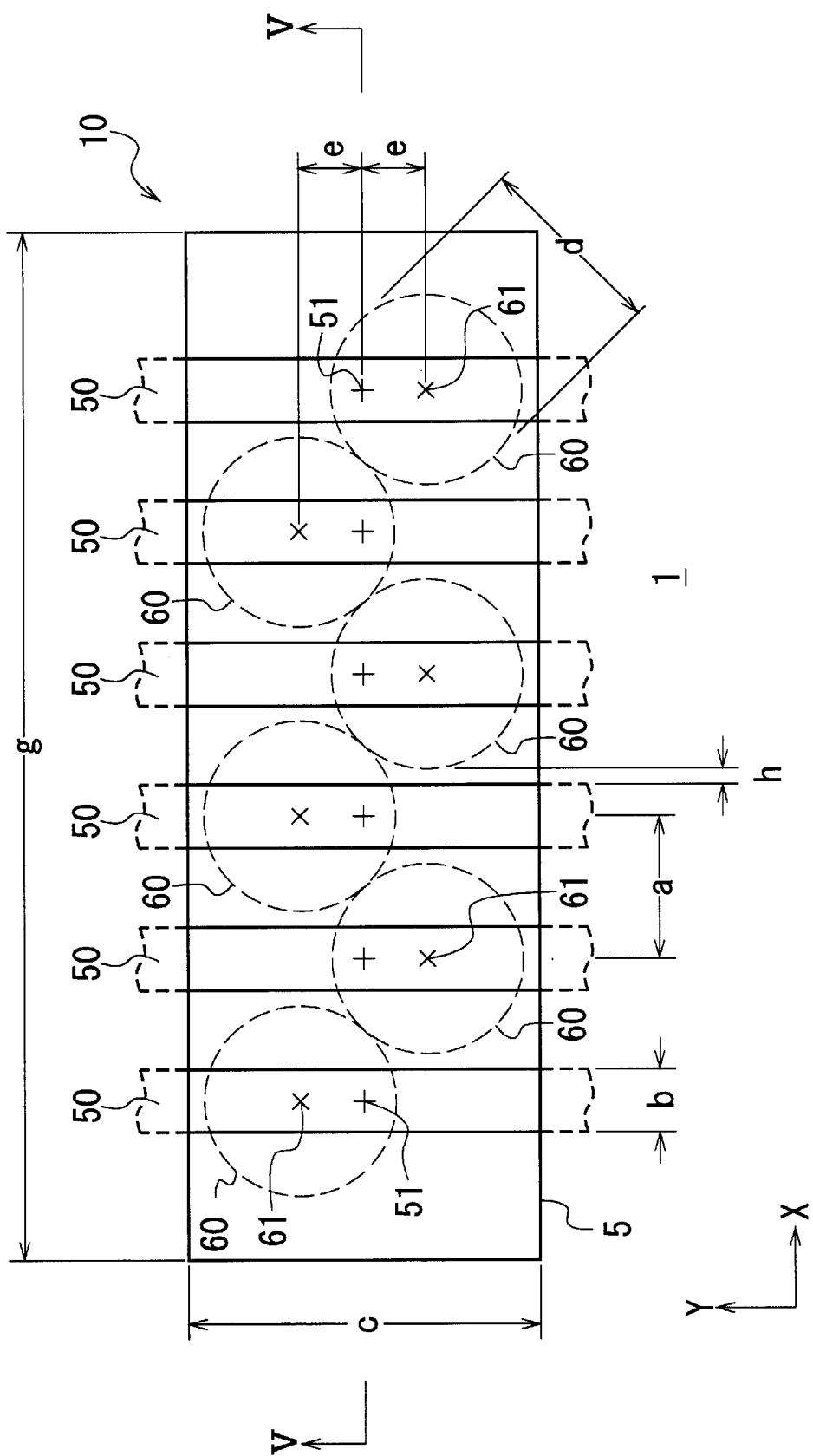
FIG. 4 is a schematic, partial plan view showing a semiconductor device with repair fuses according to a first embodiment of the present invention.
Figure 5:
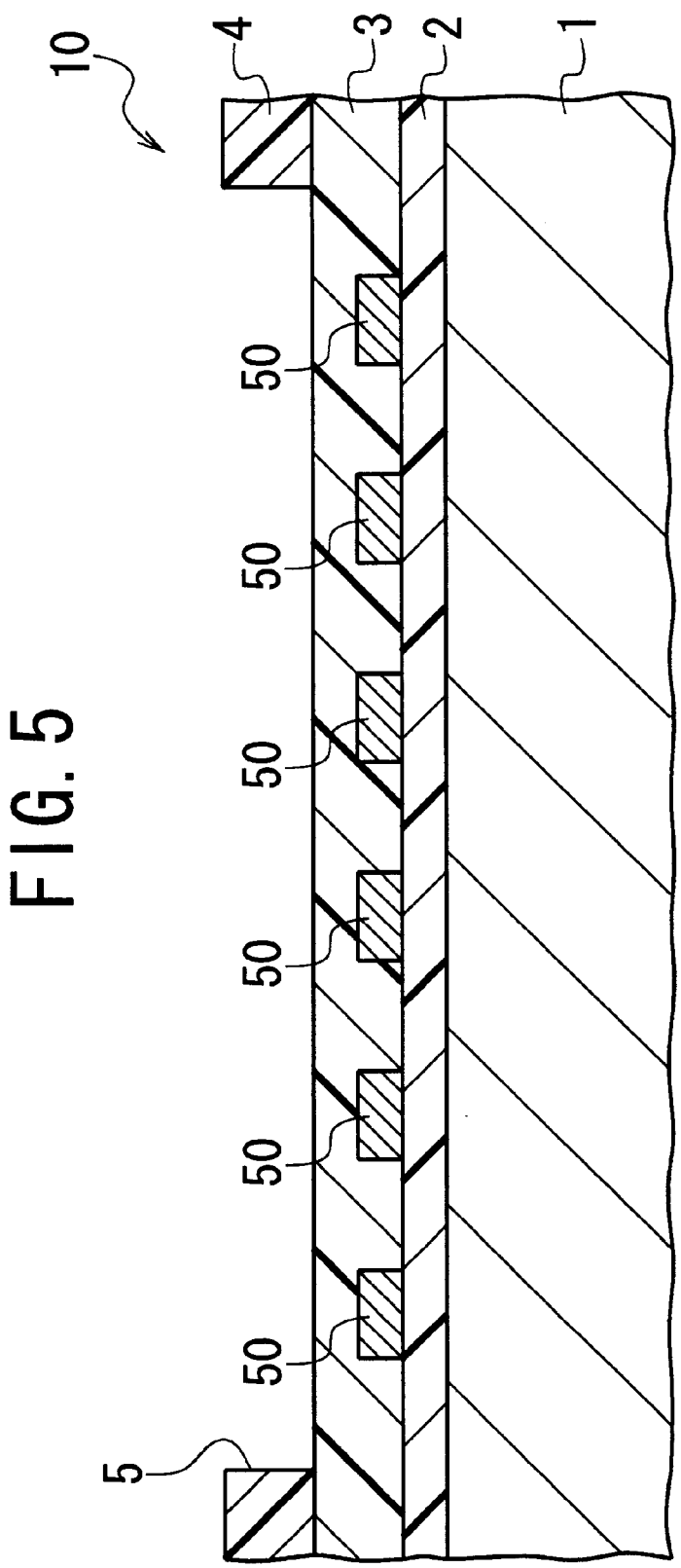
FIG. 5 is a schematic, partial cross-sectional view along the line V—V in FIG. 4.

A semiconductor device with a redundant circuit and repair fuses according to a first embodiment of the invention comprises the configuration shown in FIGS. 4 and 5. The device is configured as a memory device including redundant memory cells.

(Configuration of Semiconductor Device)

The semiconductor device 10 according to the first embodiment has a semiconductor substrate 1, on which repair fuses 50 that are fusible due to irradiation of a laser beam are formed. The fuses 50 are used for electrically connecting the redundant circuit or redundant memory cells (not shown) to the memory cell array (not shown) of the device 10 instead of the defective circuits or memory cells.

Actually, the device 10 includes several hundreds or several thousands of the fuses 50. However, for the sake of simplification of description, only six out of the fuses 50 are illustrated in FIGS. 4 and 5.

A first dielectric layer 2 is formed on the surface of the substrate 1. The fuses 50, which are made of a patterned conductive layer, are arranged on the first dielectric layer 2. Each of the fuses 50 has the same strip-like shape. The fuses 50 are arranged in parallel at the same pitch. Both ends of each fuse 50 are electrically connected to an internal circuit (not shown) of the device 10, where the internal circuit has a redundant circuit or circuits.

A second dielectric layer 3 is formed on the first dielectric layer 2 to cover all the fuses 50. The second dielectric layer 3 has a function of protecting the fuses 50.

A third dielectric layer 4, which has a rectangular opening or window 5, is formed on the second dielectric layer 3. As shown in FIG. 4, the longitudinal axis of the opening 5 is parallel to the X axis while the fuses 50 extend along the Y axis perpendicular to the X axis. The opening 5 serves as an irradiation window of a laser beam.

With the semiconductor device 10 according to the first embodiment, the desired fuses 50 are fused and cut by irradiating successively a laser beam (not shown) thereto. The motion of the laser beam is shown in FIG. 4. Specifically, the centers 61 of the irradiation areas 60 of the laser beam (i.e., the laser beam spots) for the respective fuses 50 are shifted to each other in the longitudinal direction of the fuses 50 (i.e., along the Y axis). The shifting directions of the fuses 50 are changed alternately; in other words, the irradiation areas 60 are arranged in a zigzag shape along the X axis.

In the semiconductor device 10 according to the first embodiment, the pitch a of the fuses 50 (i.e., the fuse pitch) and the width b of the fuses 50 (i.e., the fuse width) are determined under the presupposition that the laser beam is irradiated to the fuses 50 in such the way as described above.

Here, it is supposed that the diameter of the laser beam irradiation areas 60 (i.e., the laser beam irradiation diameter)

is defined as d and the acceptable placement error range (i.e., the placement tolerance) of the beam is defined as h. In this case, the fuse pitch a is determined so as to satisfy the following relationship (1).

$$d \geq a \geq \left(\frac{b+d}{2} + h\right) \quad (1)$$

The relationship (1) expresses the meaning that the fuse pitch a is equal to or smaller than the laser beam irradiation diameter d of the areas 60 and at the same time, the areas 60 are not overlapped with the adjacent fuses 50 to the target or desired fuse 50 to be fused and cut. Accordingly, it is seen that the pitch a (and therefore, the fuse occupation area) can be decreased while no short-circuit phenomenon among the adjacent fuses 50 occurs and no damage is applied to the semiconductor device 10 itself by determining the fuse pitch a so as to satisfy the relationship (1).

The fuse width b and the width c of the opening 5 are properly determined in consideration of the design rule applied to the semiconductor device 10.

The diameter d of the laser beam irradiation areas 60 is optionally set at a value that allows the desired fuses 50 to be fused and cut due to irradiation of the laser beam.

As seen from FIG. 4, each fuse 50 has a reference point 51 at a middle point of its exposed part from the opening 5. The distance between the center 61 of the irradiation area 60 and to the reference point or center 51 of the corresponding fuse 50 is defined as an offset distance e. A laser beam is preferably irradiated to the fuses 50 in such a way that the offset distance e is determined to satisfy the following relationship (2).

$$2e \geq \sqrt{d^2 - a^2} \quad (2)$$

This is because none of the areas 60 are overlapped with each other and therefore, no damages are caused in the device 10 by overlapping of the irradiated laser beam.

The diameter d of the irradiation areas 60 and the offset distance e are determined in the way explained later.

An example of these parameters is as follows.

| Fuse pitch a: | 2.5 μm |
| --- | --- |
| Fuse width b: | 1.0 μm |
| Irradiation area diameter d: | 4.0 μm |
| Offset distance e: | 3.1 μm |

The width c of the rectangular opening 5 is set at, for example, 6 μm. The length g of the opening 5 is set at a value corresponding to the values of the fuse pitch a and the fuse width b and the count of the fuses 50.

(Laser Trimming Method and Laser Repair System)

Figure 6:
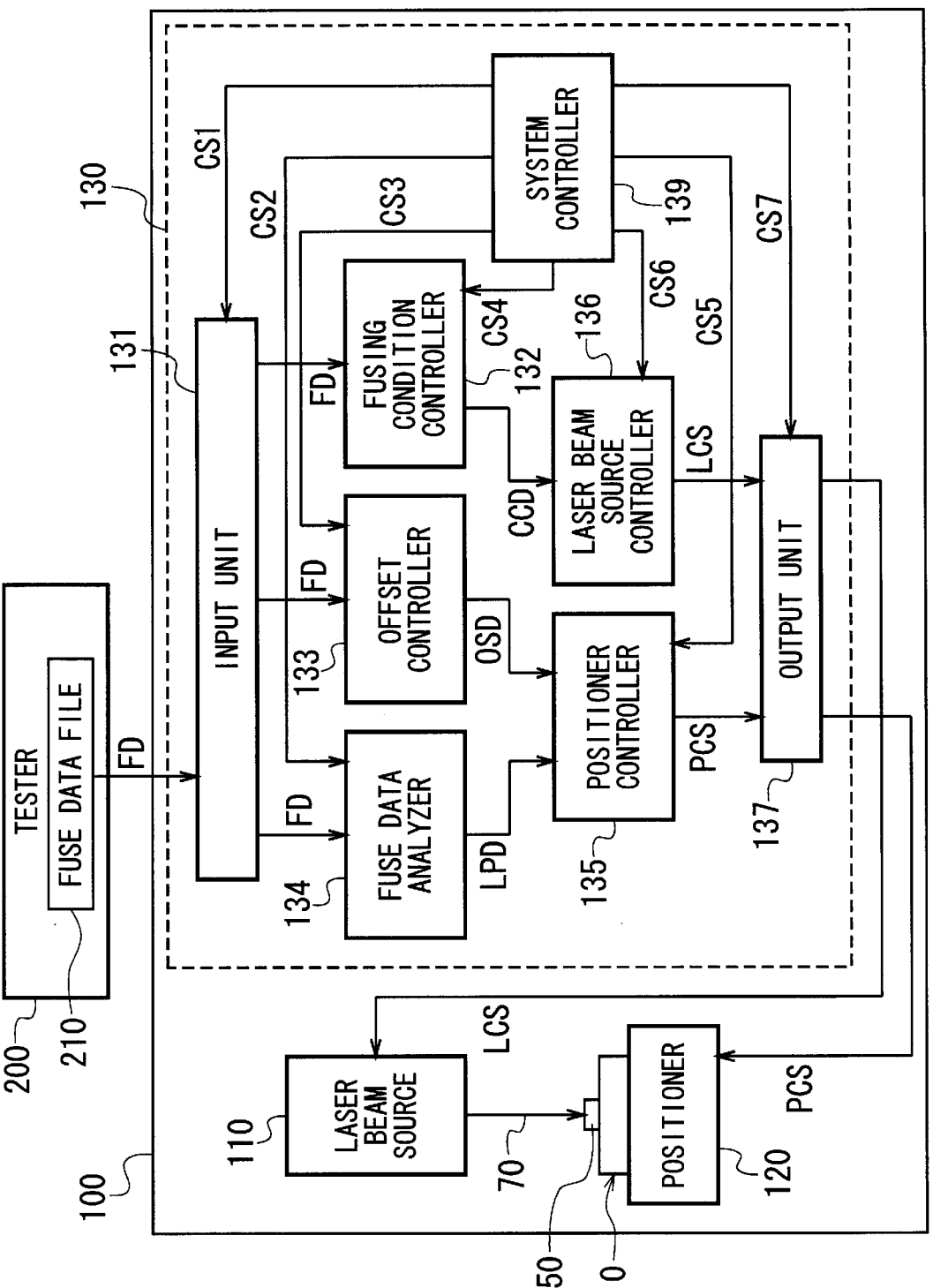
FIG. 6 is a functional block diagram showing a laser repair system used for performing a laser trimming method of the semiconductor device according to the first embodiment shown in FIGS. 4 and 5.

Next, a laser trimming method of the semiconductor device 10 according to the first embodiment is explained below, which is carried out using a laser repair system 100 shown in FIG. 6. The configuration of the system 100 is explained first.

The laser repair system 100 comprises a laser beam source 110, a positioner 120, and a laser controller subsystem 130. A tester 200 is provided outside the system 100.

The laser controller subsystem 130 comprises an input unit 131, a fusing condition controller 132, an offset controller 133, a fuse data analyzer 134, a positioner controller 135, a laser beam source controller 136, an output unit 137, and a system controller 139.

The input unit 131 receives a fuse data FD supplied from the fuse data file 210 in the tester 200 and sends the data FD thus received to the fusing condition controller 132, the offset controller 133, and the fuse data analyzer 134.

The fusing condition controller 132 adjusts the size (i.e., diameter) and the energy of a laser beam 70 on the basis of the fuse data FD sent from the input unit 131. Then, the controller 132 sends the data on the diameter and energy of the beam 70 to the laser beam source controller 136 as a fusing (or fuse cutting) condition data CCD.

The offset controller 133 determines the offset distance e of the irradiation areas 60 (i.e., fusing and cutting positions) of the fuses 50 on the basis of the fuse data FD supplied. The controller 133 sends the data on the offset distance e to the positioner controller 135 as an offset data OSD.

The fuse data analyzer 134 analyzes the fuse data FD supplied and calculates the irradiation positions of the laser beam 70. The analyzer 134 sends the calculated data on the irradiation positions to the positioner controller 135 as an irradiation data LPD.

The positioner controller 135 generates a position control signal PCS for controlling the positioner 120 on the basis of the irradiation data LPD and the offset data OSD. The controller 135 sends the signal PCS to the output unit 137.

The laser beam source controller 136 generates a laser beam source control signal LCS on the basis of the fusing condition data CCD. The controller 136 sends the signal LCS to the output unit 137.

The output unit 137 outputs the position control signal PCS thus supplied to the positioner 120 and at the same time, outputs the laser beam source control signal LCS thus supplied to the laser beam source 110.

The system controller 139 controls the input unit 131, the fusing condition controller 132, the offset controller 133, the fuse data analyzer 134, the positioner controller 135, the laser beam source controller 136, and the output unit 137 by way of control signals CS1, CS2, CS3, CS4, CS5, CS6, and CS7, respectively.

The laser beam source 110 emits the laser beam 70 having a specific beam diameter value and a specific energy value determined by the fusing condition controller 132 toward the desired fuses 50 of the semiconductor device 10 on the basis of the laser beam source control signal LCS.

The positioner 120 holds the semiconductor device 10 with the fuses 50 in a horizontal plane. The positioner 120 relatively moves the device 10 according to the position control signal PCS, thereby adjusting the relative location of the device 10 with respect to the beam 70 in such a way that the laser beam 70 is irradiated to the desired fuse 50 to be cut or trimmed.

Next, the laser trimming method according to the first embodiment is explained below, which saves the defective memory cell array of the semiconductor device 10.

First, the property or characteristic of the semiconductor wafer on which the semiconductor devices 10 are formed is measured. This measurement is carried out using the tester 200 for measuring the electric characteristics, a probe card (not shown) for making electrical connection required in the electric characteristics measurement, and a prober (not shown) for successively accessing the semiconductor devices 10 on the wafer for the purpose of electrical measurement according to a specific index.

In particular, with semiconductor memories such as Random-Access Memories (DRAMs) including large-capacity memory cells, the possibility that all the memory cells are judged as good is usually small. Thus, "redundancy analysis" is usually performed to replace the defective memory cells that have found in the preliminary measurement with the redundant memory cells. Whether the defective memory cells can be repaired or not is judged on the basis of the result of the redundancy analysis. Then, the analysis result information on whether the defective memory cells can be saved or not is generated.

The tester 200 generates the fuse data file 210 describing which fuse or fuses should be cut and which chip or chips the desired fuse or fuses are located on (i.e., the memory saving information such as the information whether the defective memory cells can be saved or not, and the information about the location of the defective cells) from the result of the electrical measurement.

Figures 7, 8:
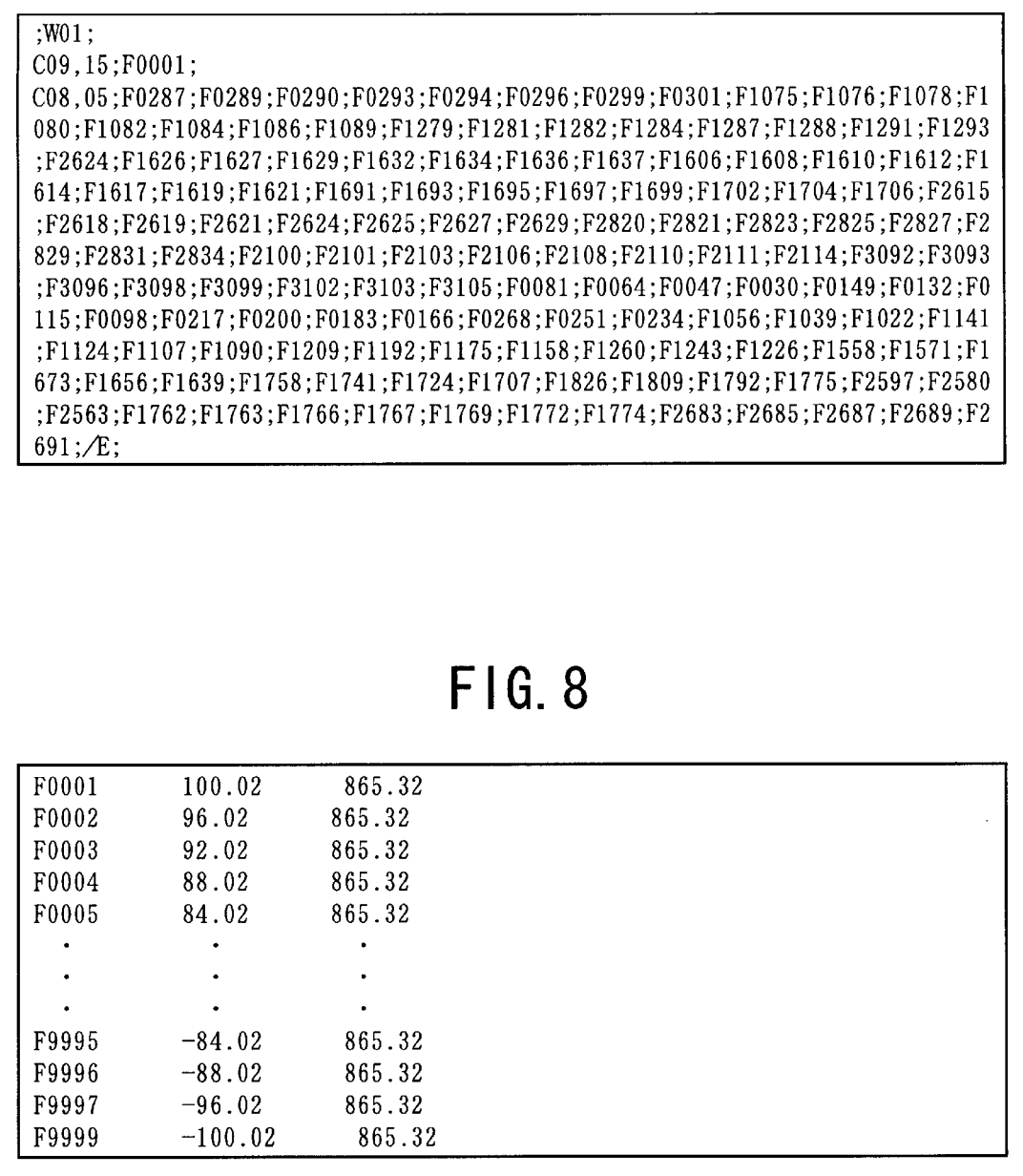

FIGS. 7 and 8 show an example of the content of the fuse data file 210. In FIG. 7, "W", "C", "F****", and "/E" denote the wafer number, chip address, fuse number, and the end of the data, respectively. In FIG. 8, each combination of two numbers denotes the x and y ordinates of a specific point in each fuse. The file representing the content of FIG. 8 is termed a "fuse table file".

Subsequent to the above-described measurement step on the property or characteristic of the semiconductor wafer on which the semiconductor devices 10 are formed, the content or information FD of the fuse data file 210 produced by the tester 200 is supplied to the laser repair system 100. Then, the desired fuse or fuses 50 on the device 10 is/are fused and cut using the system 100.

To ensure that the fuses 50 are fused and cut due to irradiation of the laser beam 70, the beam 70 needs to be generated and irradiated to the fuse 50 under a specific condition. This condition, which is termed the "laser beam irradiation condition", includes three parameters, i.e., the diameter, the energy, and the depth of focus of the beam 70. These three parameters are determined in advance by performing proper tests using test wafers at various levels and then, they are used for generating the fuse cutting condition data CCD in the fusing condition controller 132.

In the offset controller 133, the offset distance e is determined to satisfy the following conditions (i) and (ii). At this time, the fact that the offset distance e is limited by the width c of the opening 5 is considered also.

(i) The adjoining irradiation areas 60 are not overlapped to each other.

(ii) The irradiation area 60 for the target fuse 50 is not in contacted with the adjoining fuses 50 to the target fuse 50 and lines for other circuits.

As seen from FIG. 4, to satisfy the conditions (i) and (ii), the fuse pitch a increases with the decreasing offset distance e while the fuse pitch a decreases with the increasing offset distance e. The theoretical minimum limit of the pitch a is given by $$\frac{b+d}{2}$$

Figure 9:
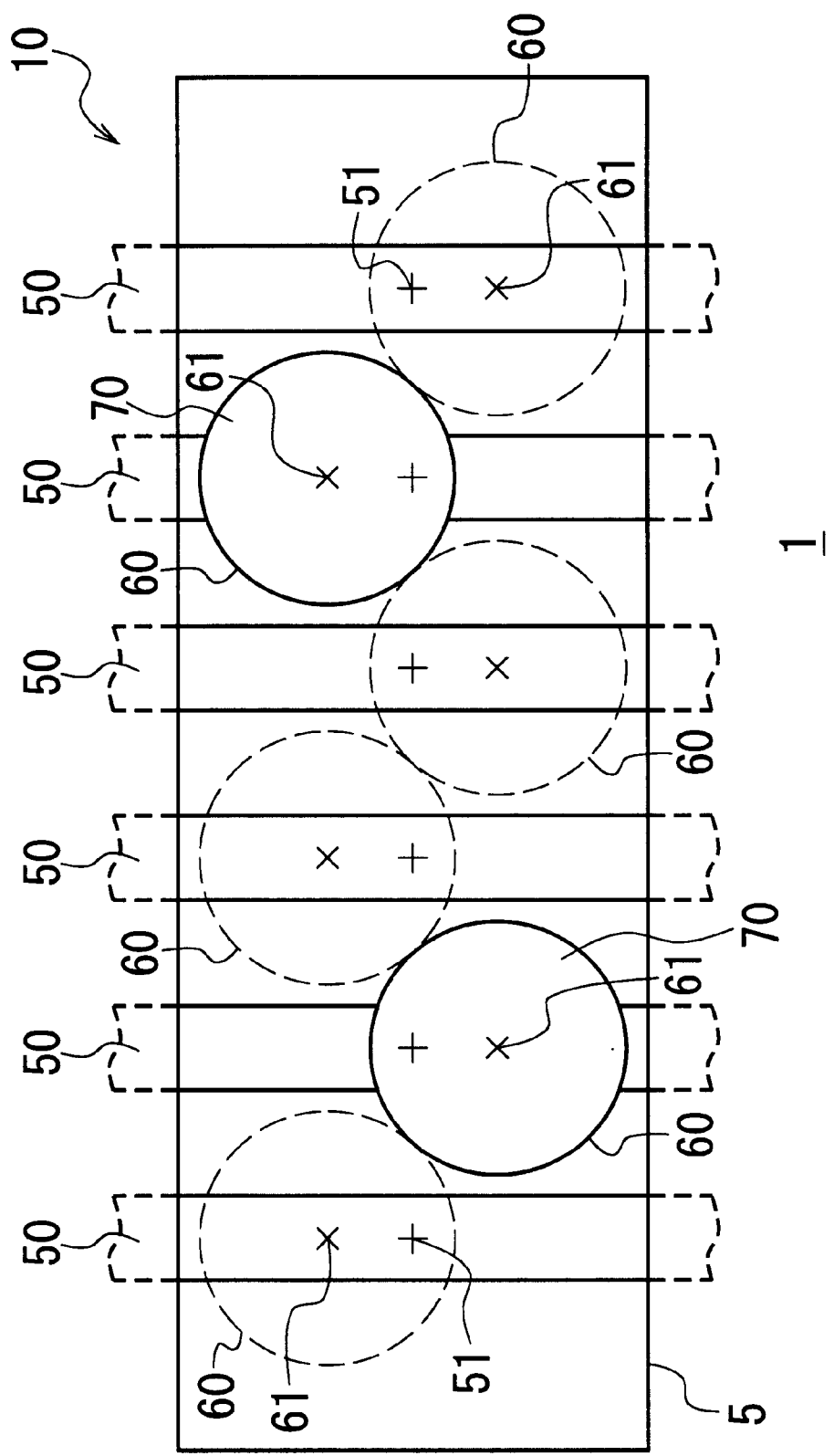
FIG. 9 is a schematic, partial plan view showing the laser trimming method according to the first embodiment of the invention.

For example, as shown in FIG. 9, the laser beam 70 is respectively irradiated to the two fuses 50 corresponding to the defective memory cells under the specified laser beam irradiation condition and the specified offset distance e, thereby fusing and cutting these fuses 50.

With the semiconductor device 10 according to the first embodiment shown in FIG. 4, the laser beam 70 is irradiated in such a way that the centers 61 of the irradiation areas 60 are alternately shifted by the offset distance e in the opposite directions along the Y axis with respect to the straight line interconnecting the reference points (i.e., the centers) 51 of the fuses 50. Thus, the centers 61 of the areas 60 are arranged in a zigzag shape with respect to the straight line interconnecting the points centers 51.

Figure 3:
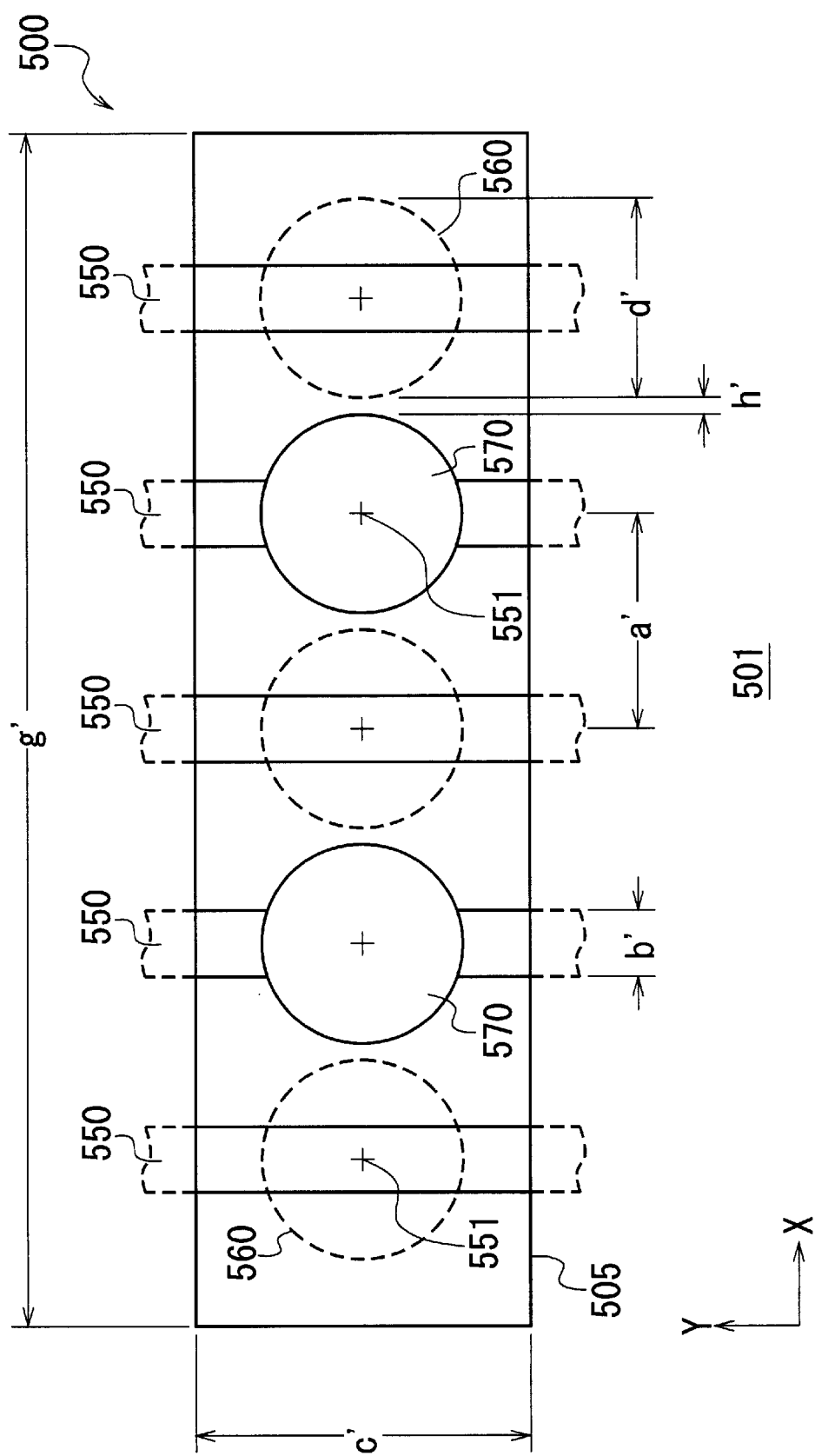
FIG. 3 is a schematic partial plan view showing a prior-art semiconductor device with repair fuses.

On the other hand, with the prior-art semiconductor device 500 shown in FIG. 3, the laser beam 570 is irradiated in such a way that the centers of the irradiation areas 560 are in accordance with the centers 551 of the corresponding fuses 550. Thus, all the centers of the areas 560 are located on a straight line, not in a zigzag shape.

According to the design rule for the semiconductor device 10 according to the first embodiment in FIG. 4, the following relationship (3) is established.

$$\frac{b+d}{2} + h \le a \quad (3)$$

If d=4.0 μm, and h=0 μm, and b=1.0 μm in relationship (3), the following relationship (4) is given.

$$\frac{4.0+1.0}{2} + 0 \le a \quad (4)$$

As a result, it is found from the relationship (4) that the minimum value of the fuse pitch a is 2.5 μm in the semiconductor device 10 according to the first embodiment.

On the other hand, according to the design rule for the prior-art semiconductor device 500 shown in FIG. 3, the following relationship (5) is established.

$$\frac{d'}{2} + h' \le \frac{a'}{2} \quad (5)$$

If d'=4.0 μm and h'=0 μm in relationship (5), the following relationship (6) is given.

$$\frac{4.0}{2} + 0 \le \frac{a'}{2} \quad (6)$$

As a result, it is found from the relationship (6) that the minimum value of the fuse pitch a' is 4 μm in the prior-art semiconductor device 500. Thus, the minimum value of the fuse pitch a in the device 10 according to the first embodiment is equal to five eighths (⅝) of the prior-art device 500.

With the device 10 according to the first embodiment, since the irradiation areas 60 are arranged in a zigzag shape, there is an anxiety that the throughput of the device 10 is lower than the prior-art device 500. However, if the laser beam 70 is scanned on a straight line along the X axis on the one side with respect to the centers 51 of the fuses 50 and then, it is scanned on another straight line along the X axis on the other side thereof, the throughput degradation can be easily suppressed. Moreover, since the moving or scanning rate or speed of the positioner 120 of the laser repair system 100 is usually set to have a sufficient margin, the throughput degradation itself can be controlled as small as possible.

The irradiation areas 60 are arranged in a zigzag shape and therefore, the length of the exposed fuses 50 from the opening 5 in the device 10 is greater than that of the fuses 500 in the prior-art device 500. Thus, there is an anxiety that the occupation area of the fuses 50 in the device 10 is wider than that of the prior-art device 500. However, it was found that the occupation area of the fuses 50 is less than that of the fuses 500 in the prior-art device 500 if the count of the fuses 50 is greater than a specific value.

Figure 10:
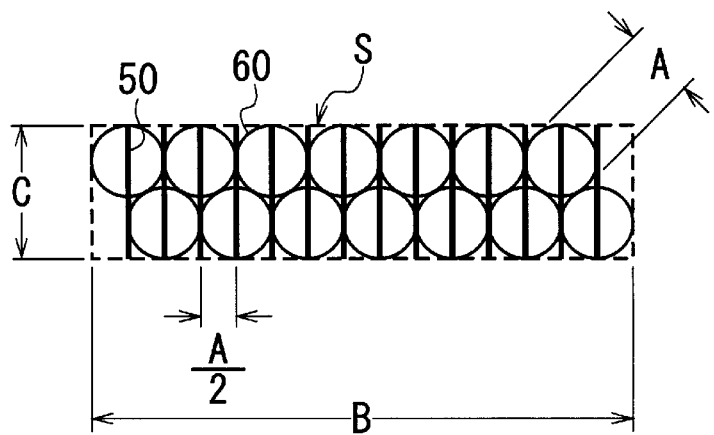
FIG. 10 is a schematic, partial plan view showing the fuse occupation area in the semiconductor device according to the first embodiment of the invention.

FIG. 10 shows the occupation area of the fuses 50 in the device 10 according to the first embodiment, in which the count of the fuses 50 is set as 14 and the occupation area has an effective width B and an effective length C. The width b of the fuses 50 is set at 0 in FIG. 10 for the sake of easier understanding.

In FIG. 10, the effective length C of the occupation area is equal to the width c of the rectangular opening 5 and thus, the following relationship is established.

$$C = A(1+\sin 60°) \quad (7)$$

Since B=7.5 A, the occupation area S of the fuses 50 is given by the following equation (8), where A is the spot diameter of the laser beam 70.

$$S = 7.5A^2 \times (1+0.867) = 13.995A^2 \quad (8)$$

The effective length C of the fuses 50 (i.e., the width c of the opening 5) is equal to 1.87 times as large as the spot diameter A (=d) of the beam 70. Since the offset distance e can be decreased by increasing the fuse pitch a, the width c of the window 5 can be decreased. Thus, the width c is equal to or less than 1.87 times as large as the diameter A (=d).

Figure 11:
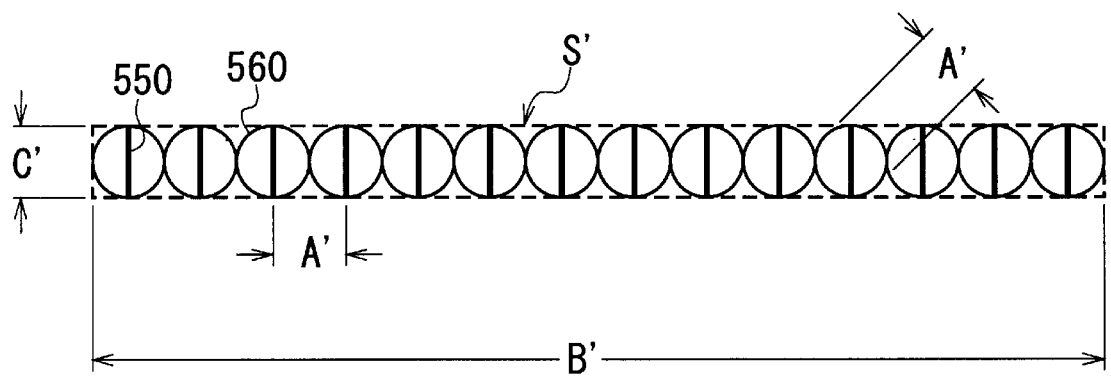
FIG. 11 is a schematic, partial plan view showing the fuse occupation area in the prior-art semiconductor device shown in FIG. 3.

FIG. 11 shows the fuse occupation area in the prior-art semiconductor device 500, in which the count of the fuses 550 is set as 14 and the occupation area has an effective width B' and an effective length C'. The width b' of the fuses 550 is set at 0 in FIG. 11 for the sake of easier understanding.

In FIG. 11, the relationships of C'=A and B'=14A are established and therefore, the occupation area S' of the fuses 550 is given as $$S' = 14A'^2 \quad (9)$$

With the semiconductor device 10 and the laser trimming method according to the first embodiment, as explained above, the fuse pitch a is determined so as to satisfy the above-described relationship (1). Also, the laser beam 70 is irradiated in a zigzag shape so as to satisfy the above-described relationship (2). Thus, the fuse pitch a is equal to or smaller than the diameter d of the beam 70 and at the same time, the beam 70 is irradiated in such a way that irradiation areas 60 are not overlapped with the adjoining fuses 50 to the target fuse 50 to be cut. As a result, the fuse pitch a can be reduced without short circuit among the adjoining fuses 50 and damage to the device 10 itself. Due to the reduction of the fuse pitch a, the fuse occupation area S can be decreased.

Moreover, the reflection plate and the reflection layer used in the prior-art techniques in the Japanese Non-Examined Patent Publication Nos. 7-273200 and 5-29467 are not necessary. Thus, the fuse pitch a can be decreased without increasing the fabrication cost of the device 10.

Since the irradiation areas 60 are not overlapped with each other, the damage to the device 10 due to irradiation overlapping of the beam 70 can be prevented.

(Test Calculation)

The inventor performed test calculation under the condition that the diameters d and d' of the irradiation areas 60 and 560 were set at 5.0 μm and the widths b and b' of the fuses 50 and 500 were set at 0.3 μm. As a result, it was found that the fuse occupation area S of the device 10 of the first embodiment was smaller than the fuse occupation area S' of the prior-art device 500 when the count of the fuses 50 and 500 was set at 85 or greater.

Actually, the count of the fuses 50 and 500 is usually set at a value of several hundreds to several thousands. As a result, the advantages of the device 10 of the first embodiment that the fuse occupation area S is decreased is more conspicuous than described here.

Second Embodiment

Figure 12:
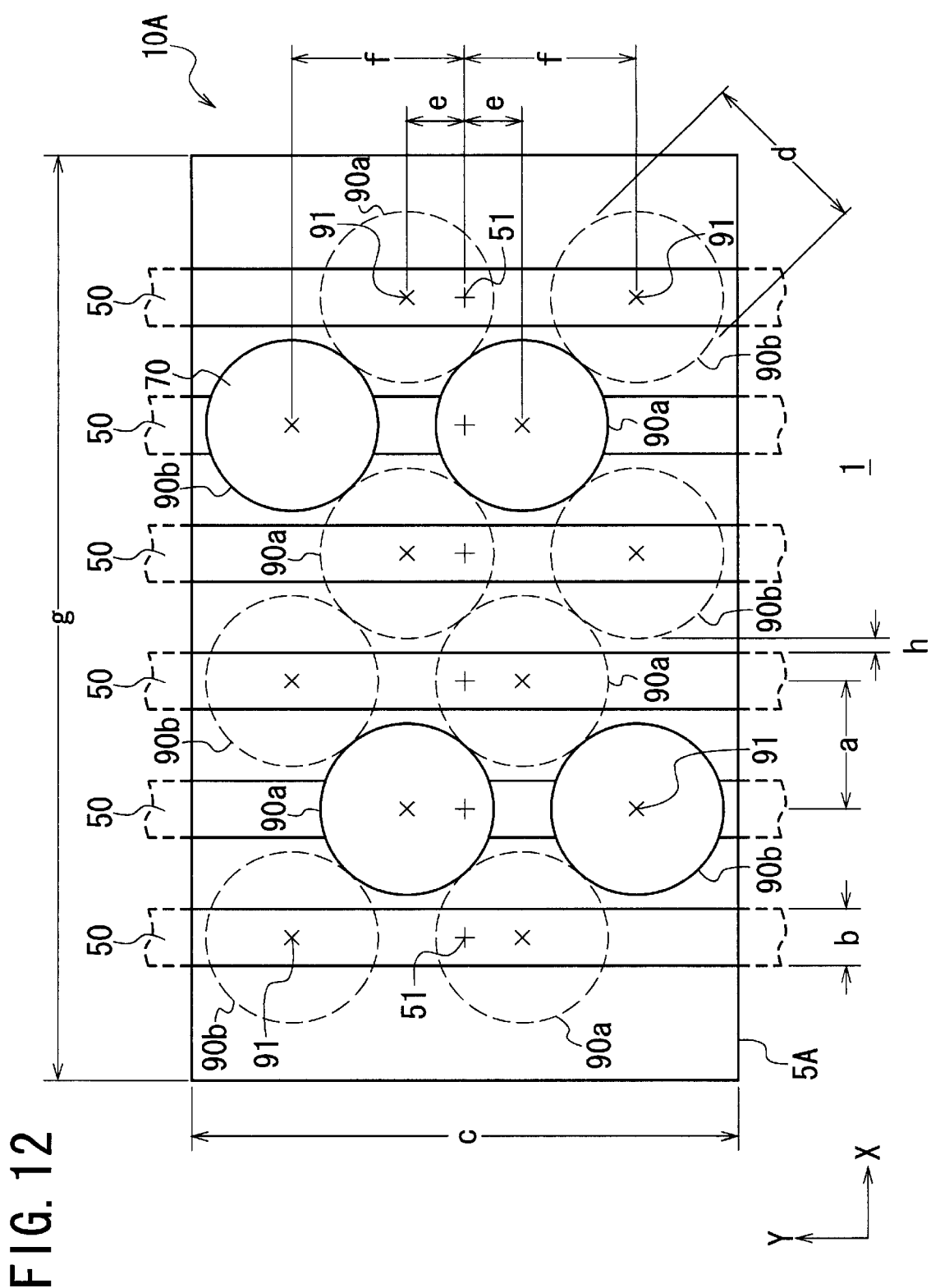
FIG. 12 is a schematic, partial plan view showing a semiconductor device with repair fuses according to a second embodiment of the present invention.

FIG. 12 shows a semiconductor device with repair fuses according to a second embodiment of the present invention, which includes the same configuration as that of the first embodiment of FIG. 4 except that two laser beam irradiation areas (i.e., laser beam spots) are formed on each of the fuses 50. Therefore, the explanation about the same configuration is omitted here for the sake of simplification by attaching the same reference symbols as used in the first embodiment in FIG. 12.

In the semiconductor device 10A according to the second embodiment, unlike the device 10 according to the first embodiment, laser beam irradiation areas 90a are arranged along the X axis at an offset distance e and at the same time, laser beam irradiation areas 90b are arranged along the X axis at another offset distance f, where f=3e.

The effective length of the fuses 50 (i.e., the width c of a rectangular opening 5A) is equal to approximately two times as large as that in the first embodiment, which is equal to or less than approximately 3.73 times as large as the spot diameter d of the laser beam 70.

When some of the fuses 50 on the device 10A are trimmed, the laser beam 70 is irradiated to the specified fuse 50 to form the irradiation area 90a and then, it is irradiated to the same fuse 50 to form the irradiation area 90b. As a result, as shown in FIG. 12, the specified fuse 50 are fused and cut at the two areas 90a and 90b.

It is clear that the semiconductor device 10A and the laser trimming method according to the second embodiment have approximately the same advantages as those in the first embodiment. Moreover, there is an additional advantage that cutting of the specified or wanted fuses 50 can be ensured and that the fusing and cutting of the fuses 50 can be realized at a high rate even if the fuses 50 are difficult to be cut.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device comprising:
   (a) a semiconductor substrate;
   (b) elongated repair fuses formed on said substrate;
       said fuses being arranged in substantially parallel to each other at a pitch a;
       each of said fuses having a width b;
   (c) a layer formed to cover said fuses;
       said layer having an opening that exposes said fuses and that allows said fuses to receive a laser beam from the outside;
       said beam having a placement tolerance h for each of said fuses in said opening;
       said beam being designed to form an irradiation area with a diameter d for each of said fuses in said opening;
       said irradiation area for each of said fuses being arranged along a virtual zigzag shape in said opening; and
   (d) a relationship of $$d \geq a \geq \left(\frac{b+d}{2} + h\right)$$

is established among the pitch a, the width b, and the placement tolerance h.

2. The device according to claim 1, wherein each of said fuses has a reference point at a middle point of its exposed part from said the opening;
   and wherein each of said irradiation areas is located in such a way that a center of said area has an offset distance e from said reference point of said corresponding fuse, said offset distance e satisfying a relationship of $$2e \geq \sqrt{d^2-a^2}.$$

3. The device according to claim 2, wherein said opening of said layer is substantially rectangular.

4. The device according to claim 1, wherein said opening of said layer has a substantially rectangular shape with a length c along said fuses and a width g perpendicular to said fuses, said length c being approximately equal to or less than (1.87×d).

5. A semiconductor device comprising:
   (a) a semiconductor substrate;
   (b) elongated repair fuses formed on said substrate;
       said fuses being arranged in substantially parallel to each other at a pitch a;
       each of said fuses having a width b;
   (c) a layer formed to cover said fuses;
       said layer having an opening that exposes said fuses and that allows said fuses to receive a laser beam from the outside;
       said beam having a placement tolerance h for each of said fuses in said opening;
       said beam being designed to form a first irradiation area and a second irradiation area apart from each other for each of said fuses in said opening;
       each of said first irradiation areas and each of said second irradiation areas having an equal diameter d;
       said first irradiation area for each of said fuses being arranged along a first virtual zigzag shape and said second irradiation area for each of said fuses being arranged along a second virtual zigzag shape in said opening; and
   (d) a relationship of $$d \geq a \geq \left(\frac{b+d}{2} + h\right)$$

is established among the pitch a, the width b, and the placement tolerance h.

6. The device according to claim 5, wherein each of said fuses has a reference point at a middle point of its exposed part from said opening;
   and wherein each of said first irradiation areas is located in such a way that a center of said first irradiation area has a first offset distance e from said reference point of said corresponding fuse;
   and wherein each of said second irradiation areas is located in such a way that a center of said second irradiation area has a second offset distance f from said reference point of said corresponding fuse;
   and wherein said first offset distance e satisfies a relationship of $$2e \geq \sqrt{d^2-a^2}$$

and wherein said second offset distance f satisfies a relationship of f=n×e, where n is a positive constant.

7. The device according to claim 6, wherein said opening of said layer is substantially rectangular.

8. The device according to claim 5, wherein said opening of said layer has a substantially rectangular shape with a length c along said fuses and a width g perpendicular to said fuses, said length c being approximately equal to or less than (3.73×d).

9. A laser trimming method of a semiconductor device, in which said device comprises;
   (i) a semiconductor substrate;
   (ii) elongated repair fuses formed on said substrate;
       said fuses being arranged in substantially parallel to each other at a pitch a;
       each of said fuses having a width b; and
   (iii) a layer formed to cover said fuses;
       said layer having an opening that exposes said fuses;
       said method comprising the steps of successively irradiating a laser beam to said respective fuses at a placement tolerance h, thereby forming irradiation areas with an equal diameter d for said respective fuses in said opening;
       wherein said beam is moved so as to arrange said irradiation areas for said respective fuses along a virtual zigzag shape in said opening while the pitch a, the width b, and the placement tolerance h satisfy a relationship of $$d \geq a \geq \left(\frac{b+d}{2} + h\right).$$

10. The method according to claim 9, wherein each of said fuses has a reference point at a middle point of its exposed part from said opening;
    and wherein each of said irradiation areas is located in such a way that a center of said area has an offset distance e from said reference point of said corresponding fuse, said offset distance e satisfying a relationship of $$2e \geq \sqrt{d^2-a^2}.$$

11. The method according to claim 10, wherein said opening of said layer is substantially rectangular.

12. The method according to claim 9, wherein said opening of said layer has a substantially rectangular shape with a length c along said fuses and a width g perpendicular to said fuses, said length c being approximately equal to or less than (1.87×d).

13. The method according to claim 9, wherein said beam is moved along a straight line to form said irradiation areas located at one side with respect to a reference line interconnecting said reference points of said fuses and then, said beam is moved along another straight line to form said irradiation areas located at the other side with respect to said reference line.

14. A laser trimming method of a semiconductor device, in which said device comprises;
    (i) a semiconductor substrate;
    (ii) elongated repair fuses formed on said substrate;
        said fuses being arranged in substantially parallel to each other at a pitch a;
        each of said fuses having a width b; and
    (iii) a layer formed to cover said fuses;
        said layer having an opening that exposes said fuses;
        said method comprising the steps of successively irradiating a laser beam to said respective fuses at a placement tolerance h, thereby forming a first irradiation area and a second irradiation area with an equal diameter d for each of said fuses in said opening;
        wherein said first irradiation areas and said second irradiation areas are apart from each other on each of said fuses;

and wherein said beam is moved so as to arrange said first irradiation area for each of said fuses along a first virtual zigzag shape and said second irradiation area for each of said fuses along a second virtual zigzag shape in said opening while the pitch a, the width b, and the placement tolerance h satisfy a relationship of $$d \geq a \geq \left(\frac{b+d}{2} + h\right).$$

15. The method according to claim 14, wherein each of said fuses has a reference point at a middle point of its exposed part from said opening;

and wherein each of said first irradiation areas is located in such a way that a center of said first irradiation area has a first offset distance e from said reference point of said corresponding fuse;

and wherein each of said second irradiation areas is located in such a way that a center of said second irradiation area has a second offset distance f from said reference point of said corresponding fuse;

and wherein said first offset distance e satisfies a relationship of $$2e \geq \sqrt{d^2 - a^2};$$

and wherein said second offset distance f satisfies a relationship of f=n×e, where n is a positive constant.

16. The method according to claim 15, wherein said opening of said layer is substantially rectangular.

17. The method according to claim 14, wherein said opening of said layer has a substantially rectangular shape with a length c along said fuses and a width g perpendicular to said fuses, the length c being approximately equal to or less than (3.73×d).

18. The method according to claim 14, wherein said beam is moved along a straight line to form said first or second irradiation areas located at one side with respect to a reference line interconnecting said reference points of said fuses and then, said beam is moved along another straight line to form said first or second irradiation areas located at the other side with respect to said reference line.

19. The method according to claim 14, wherein said positive constant n is set at 3.

* * * * *